United States Patent
Ohishi

(10) Patent No.: US 7,245,092 B2
(45) Date of Patent: Jul. 17, 2007

(54) ALIGNMENT STAGE APPARATUS, EXPOSURE APPARATUS, AND SEMICONDUCTOR DEVICE MANUFACTURING METHOD

(75) Inventor: Shinji Ohishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 456 days.

(21) Appl. No.: 10/924,977

(22) Filed: Aug. 25, 2004

(65) Prior Publication Data
US 2005/0052143 A1    Mar. 10, 2005

(30) Foreign Application Priority Data
Sep. 9, 2003    (JP)    ............... 2003-317322

(51) Int. Cl.
*H02P 1/00*    (2006.01)

(52) U.S. Cl. .................. 318/135; 318/687; 318/38; 355/72; 355/75

(58) Field of Classification Search .......... 318/687, 318/135, 38; 355/72, 75
See application file for complete search history.

(56) References Cited

U.S. PATENT DOCUMENTS

| | | | |
|---|---|---|---|
| 4,810,941 A | 3/1989 | Ohishi et al. | ............... 318/314 |
| 5,184,055 A | 2/1993 | Ohishi et al. | ............... 318/615 |
| 5,260,580 A | 11/1993 | Itoh et al. | ............... 250/492.2 |
| 5,666,038 A | 9/1997 | Ohishi | ............... 318/625 |
| 5,684,856 A | 11/1997 | Itoh et al. | ............... 378/34 |
| 6,408,045 B1 | 6/2002 | Matsui et al. | ............... 378/34 |
| 6,646,721 B2* | 11/2003 | Compter et al. | ............... 355/72 |
| 6,888,619 B2* | 5/2005 | Trost | ............... 355/72 |
| 2002/0089657 A1* | 7/2002 | Okubo | ............... 355/76 |
| 2003/0136923 A1* | 7/2003 | Watson | ............... 250/492.3 |
| 2004/0174505 A1* | 9/2004 | Terashima | ............... 355/30 |
| 2004/0246455 A1* | 12/2004 | Emoto | ............... 355/53 |
| 2005/0018166 A1* | 1/2005 | Akutsu et al. | ............... 355/72 |

FOREIGN PATENT DOCUMENTS

JP    2000-227358    8/2000

* cited by examiner

*Primary Examiner*—Rina Duda
(74) *Attorney, Agent, or Firm*—Fitzpatrick, Cella, Harper & Scinto

(57) ABSTRACT

An alignment stage apparatus including a vacuum chamber, a linear motor including a plurality of coils to drive a stage, a coil selector which selectively energizes the plurality of coils, and a storage box arranged to store the coil selector. The interior of the storage box is connected to the outside of the vacuum chamber. The linear motor and the storage box are arranged in the vacuum chamber.

7 Claims, 8 Drawing Sheets

ALIGNMENT STAGE APPARATUS, EXPOSURE APPARATUS, AND SEMICONDUCTOR DEVICE MANUFACTURING METHOD

FIELD OF THE INVENTION

The present invention relates to an alignment stage apparatus, an exposure apparatus, and a semiconductor device manufacturing method.

BACKGROUND OF THE INVENTION

FIG. 4 is a view showing a conventional alignment stage apparatus applied to an exposure apparatus. The conventional alignment stage apparatus has linear motor coils 104, which are four-phase coils, arrayed on one straight line to drive a stage. The linear motor coils 104 are supported by a coil support member 103 fixed to a surface plate (not shown) in a vacuum chamber 112. A pair of guides 102 are arranged in a direction parallel to the direction along which the linear motor coils 104 are arrayed. A stage top plate 101 is attached to the guides 102 through bearings 106. The stage top plate 101 is freely guided by the guides 102 in the direction along which the linear motor coils 104 are arrayed. A moving magnet 105 is attached to the stage top plate 101 through a moving magnet connecting member 113. The moving magnet 105 includes four pairs of permanent magnets, the polarities of which alternate in the direction along which the linear motor coils 104 are arrayed. A laser interferometer measuring mirror 107 is arranged on the upper surface of the stage top plate 101 to detect the position of the stage top plate 101. In the vacuum chamber 112, as power lines 108, fluoroplastic-based wires, and the like, which are heat-resistant and generate comparatively fewer gases, are generally used (for example, see Japanese Patent Laid-Open No. 2000-227358). The power lines 108 extend to the outside of the vacuum chamber 112 through a feed-through connector 109. In this manner, an alignment stage apparatus 400 is arranged in the vacuum chamber 112.

A coil selector 110 is arranged outside the vacuum chamber 112. FIG. 5 is a view schematically showing the arrangement of the coil selector 110. In the coil selector 110, switches 114 are arranged in series with the respective linear motor coils 104. The switches 114 include mechanical contact relays or switches like semiconductor switches, i.e., FETs (Field-Effect Transistors). The switches 114 perform switching appropriately in accordance with the positional relationship between the moving magnet 105 and linear motor coils 104. A driver 111 is connected to the input of the coil selector 110. The driver 111 supplies a control current to a selected linear motor coil 104 in response to a control command, to control alignment of the stage. The coil selector 110 serves to turn on/off the switches 114 in accordance with a coil select signal to supply a current to a desired linear motor coil 104. When drivers 111 are provided to the respective linear motor coils 104, the number of drivers 111 increases in proportion to the number of linear motor coils 104.

FIG. 6 shows an arrangement of a case wherein the coil support member 103 of FIG. 4 operates as a counter mass 115. Bearings 106 are arranged on the lower surface of the counter mass 115. As indicated by an arrow in FIG. 6, when the counter mass 115 is driven in a direction opposite to the direction in which the stage is driven, the counterforce from the stage can be canceled.

In Japanese Patent Laid-Open No. 2000-227358, as the power lines 108, the fluoroplastic-based wires, which emit fewer gases, are used. As the lengths of the power lines 108 increase, however, the generated amount of emission gases becomes non-negligible. In particular, in a semiconductor device that requires an ultrahigh vacuum, the generated amount of emission gases must be minimized.

As shown in FIG. 5, the number of the plurality of power lines 108, which electrically connect the linear motor coils 104 and the switches 114 of the coil selector 110, increases in proportion to the number of linear motor coils 104. Therefore, when the number of linear motor coils 104 increases, a large number of power lines 108 must be arranged in the vacuum chamber 112. Furthermore, the number of pins of the feed-through connector 109 increases, and accordingly, the size of the feed-through connector 109 increases. Consequently, the size of the vacuum chamber 112 increases, and an increase in cost cannot be avoided.

When the coil support member 103 of a linear motor 119 operates as the counter mass 115, the counter mass 115 moves as it is driven by the stage. Hence, as shown in FIG. 6, a large number of power lines 108 is dragged in the vacuum chamber 112. Disturbance and vibration from the large number of power lines 108 degrade the alignment accuracy and posture accuracy of the alignment stage apparatus 400.

The present invention has been made in view of the above problems, and has as its object to provide an alignment stage apparatus that generates fewer gases in a vacuum atmosphere to achieve a high vacuum degree and can realize a high alignment accuracy, which is not influenced by cable disturbance and vibration.

According to the first aspect of the present invention, there is provided an alignment stage apparatus comprising a linear motor including a plurality of coils to drive a stage, and a coil selector which selectively energizes the plurality of coils, wherein the linear motor and coil selector are arranged in a vacuum chamber.

According to the second aspect of the present invention, there is provided an exposure apparatus comprising an optical system, which is arranged in a vacuum chamber and projects exposure light to irradiate a master having a pattern, onto a substrate, and the above stage apparatus, which holds and aligns the substrate or master.

According to the third aspect of the present invention, there is provided a semiconductor device manufacturing method comprising a step of exposing a pattern onto a substrate by using the above exposure apparatus, and a step of developing the substrate on which the pattern has been transferred in the step of exposing.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The present invention will be described in detail with reference to the accompanying drawings. The present invention provides an alignment stage apparatus that generates fewer gases in a vacuum atmosphere, to achieve a high vacuum degree and can realize a high alignment accuracy, which is not influenced by cable disturbance and vibration.

Figure 1:
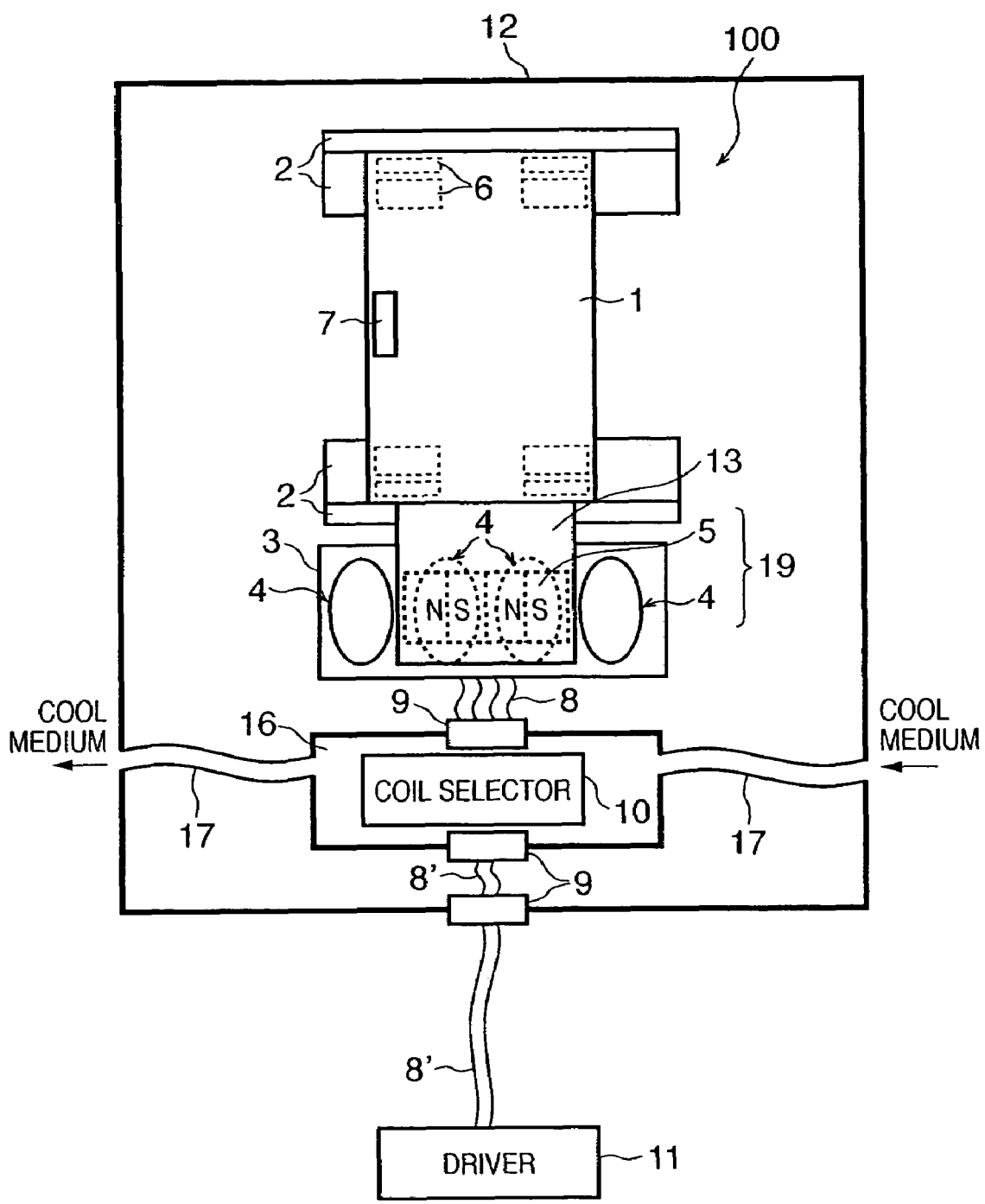
FIG. 1 is a view showing an alignment stage apparatus according to a preferred embodiment of the present invention.

FIG. 1 is a view showing an alignment stage apparatus 100 according to a preferred embodiment of the present invention. The alignment stage apparatus 100 according to the preferred embodiment of the present invention has a linear motor 19, including a plurality of linear motor coils 4, to drive a stage, and a coil selector 10, which selectively energizes the plurality of linear motor coils 4. In order to arrange the linear motor 19 and coil selector 10 in a vacuum chamber 12, power lines 8' of a driver 11 arranged outside the vacuum chamber 12 extend into the vacuum chamber 12. The driver 11 to energize the linear motor coils 4 is arranged outside the vacuum chamber 12. The coil selector 10 is electrically connected to the driver 11 through the power lines 8' extending through feed-through connectors 9. The linear motor 19 includes the linear motor coils 4 and a moving magnet 5. The linear motor coils 4 are exemplified by four-phase coils that are arranged on one straight line. However, the present invention is not limited to this, but a plurality of arbitrary linear motor coils can be used.

The alignment stage apparatus 100 desirably has a storage box 16, which stores the coil selector 10 in the vacuum chamber 12. A channel 17, through which a temperature-adjusting fluid is to flow, is desirably arranged between the interior of the storage box 16 and the outside of the vacuum chamber 12. Such a channel 17 can be realized by, e.g., providing a pipe 17 to the storage box 16, connecting the pipe 17 to the outside of the vacuum chamber 12, and supplying the fluid through the pipe 17. The coil selector 10 can be cooled by the temperature-adjusting fluid (e.g., air, nitrogen, or water). As the temperature-adjusting fluid, a cool fluid (cooled fluid) is desirably used so that the cooling effect is improved. Preferably, the storage box 16 is arranged near (e.g., above, beside, or under) the linear motor 19. More preferably, the storage box 16 is desirably, mechanically connected to the linear motor 19 through a connector 18, as shown in the second preferred embodiment. Then, power lines 8, which electronically connect the coil selector 10 and linear motor 19, can be prevented from being exposed to the vacuum atmosphere in the vacuum chamber 12.

The linear motor coils 4 are supported by a coil support member 3 fixed to a surface plate (not shown). The moving magnet 5 is arranged above the coil support member 3. The moving magnet 5 includes four pairs of permanent magnets that are arrayed in a direction parallel to the direction along which the linear motor coils 4 are arrayed, such that the polarities of the permanent magnets alternate. The moving magnet 5 is not limited to the four pairs of permanent magnets, but an arbitrary plurality of permanent magnets can be used. The moving magnet 5 is attached to a moving magnet connecting member 13 connected to a stage top plate 1. The stage top plate 1 is attached through bearings 6 to a pair of guides 2, which are arranged in a direction parallel to the direction along which the linear motor coils 4 are arrayed. The stage top plate 1 is freely guided by the guides 2 in the direction along which the linear motor coils 4 are arrayed. A laser interferometric measuring mirror 7 is arranged on the upper surface of the stage top plate 1 to detect the position of the stage top plate 1. The stage apparatus 100, including the stage top plate 1, is arranged in the vacuum chamber 12. The power lines 8 extend from the stage apparatus 100 to the outside of the vacuum chamber 12 through the feed-through connectors 9 arranged in the vacuum chamber 12. The linear motor 19 and coil selector 10 are electrically connected to each other through the power lines 8. As the material of the power lines 8 and 8' to be used in the vacuum chamber 12, a material, which is heat-resistant and generates comparatively fewer gases (e.g., a fluoroplastic-based wire), is preferably used. In order to arrange the storage box 16 near the linear motor 19, the lengths of the large number of power lines 8 extending from the coil selector 10 are preferably shorter than the lengths of the power lines 8'.

In this manner, according to this embodiment, generation of gases emitted from the large number of power lines 8 and disturbance and vibration from the power lines 8 can be suppressed by arranging the coil selector 10 in the vacuum chamber 12. Thus, the alignment accuracy and posture accuracy of the alignment stage apparatus 100 can be improved. As the coil selector 10 is arranged in the vacuum chamber 12, only the several power lines 8' need to extend from the driver 11 into the vacuum chamber 12, so that the number of pins of the feed-through connectors 9 can be decreased. Consequently, the feed-through connectors 9 are downsized, and the cost can be decreased accordingly.

The coil selector 10 is stored in the storage box 16, and the channel 17 for supplying the temperature-adjusting fluid into the storage box 16 is connected. Thus, heat generation by the coil selector 10 can be suppressed.

Figure 2:
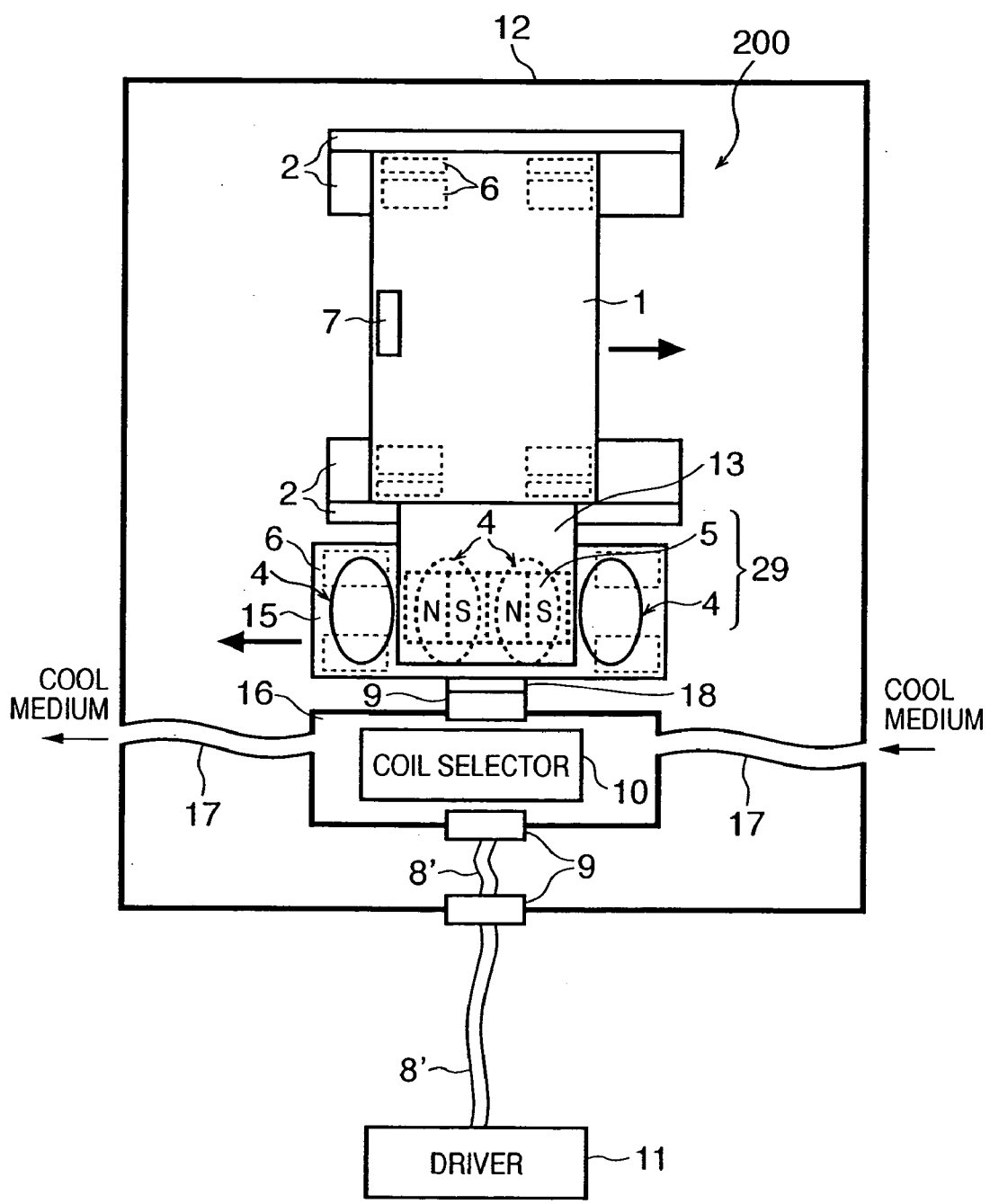
FIG. 2 is a view showing an alignment stage apparatus according to the second preferred embodiment of the present invention.
Figure 5:
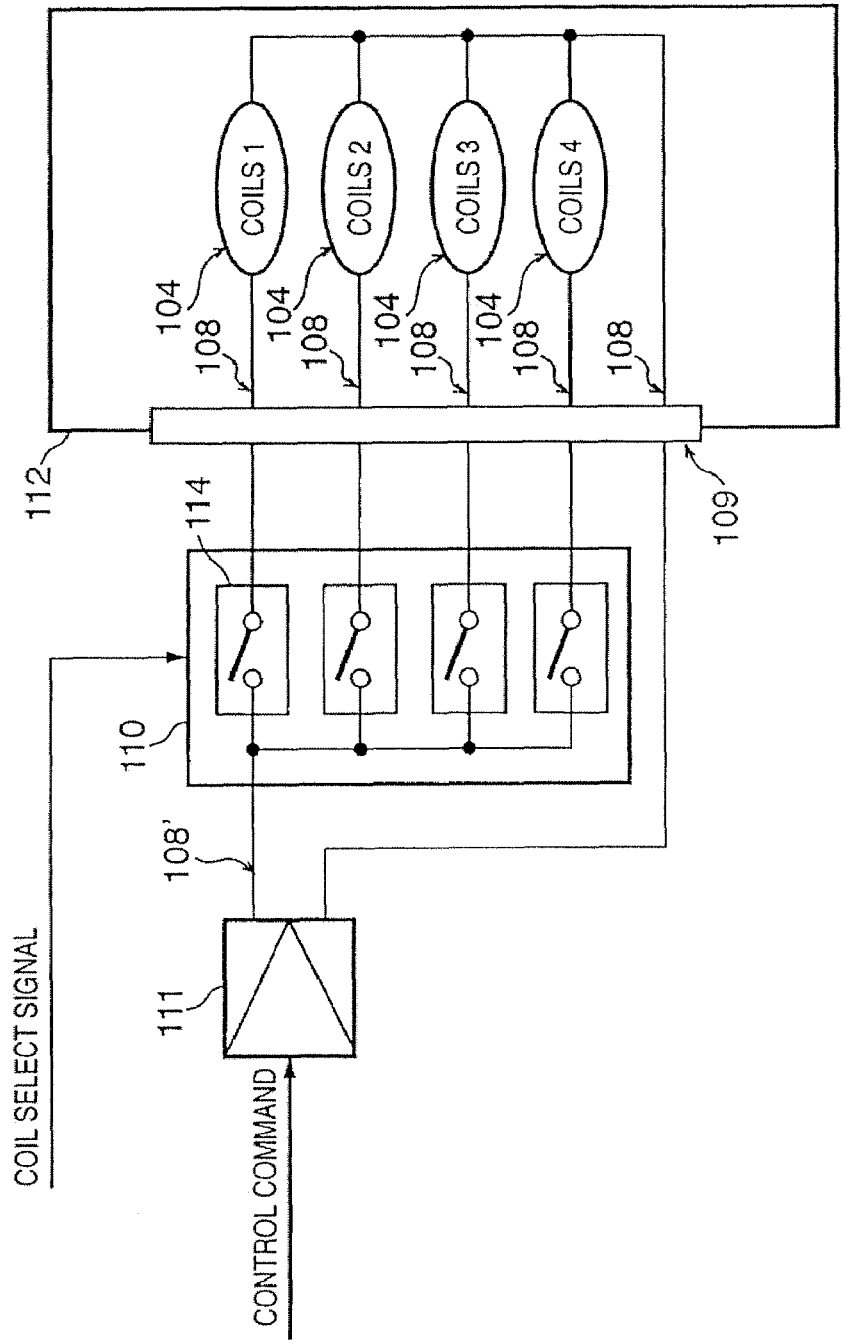
FIG. 5 is a view showing the coil selector of the alignment stage apparatus.
Figure 6:
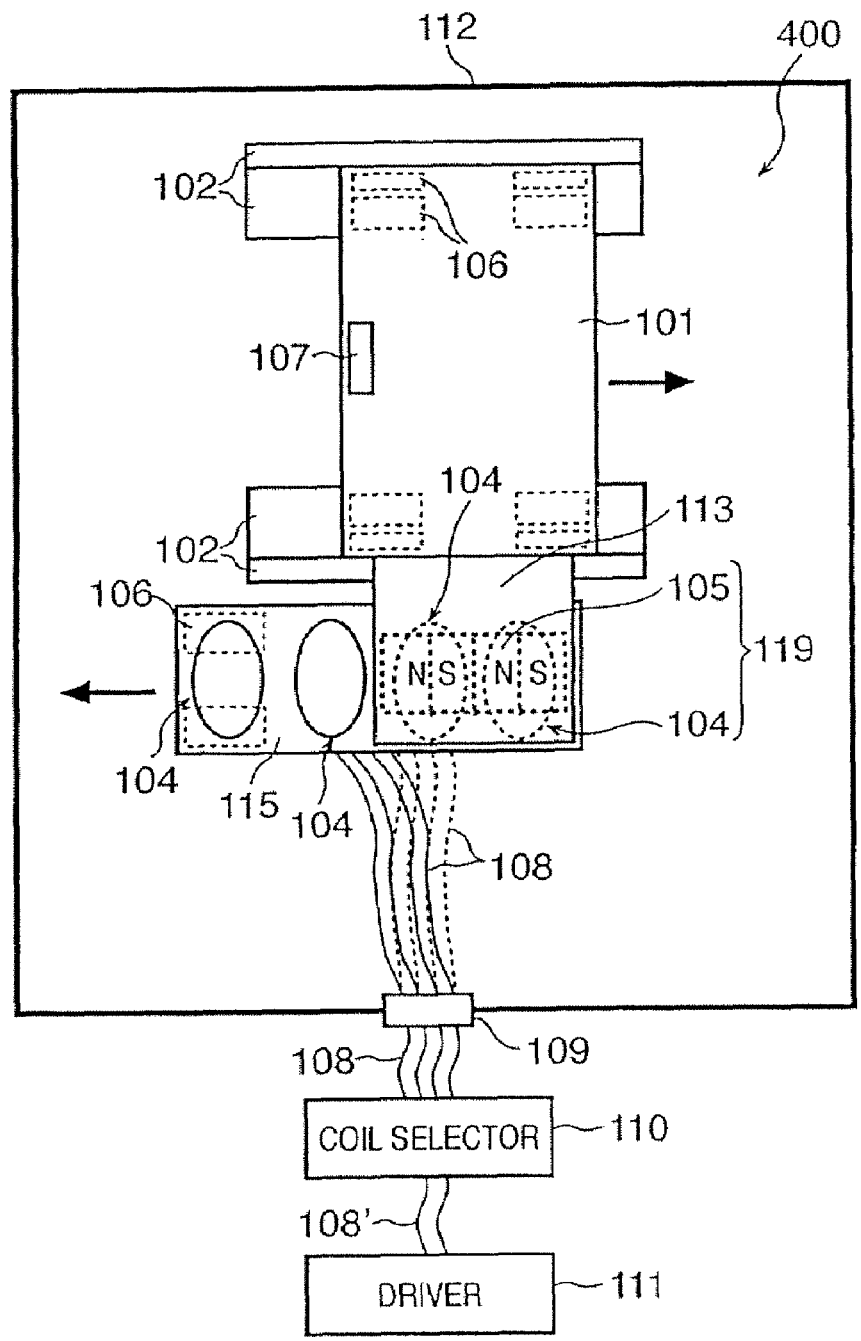
FIG. 6 is a view showing a conventional alignment stage apparatus to be applied to an exposure apparatus.

FIG. 2 is a view showing an alignment stage apparatus 200 according to the second preferred embodiment of the present invention. A storage box 16, which stores a coil selector 10, is mechanically connected to a linear motor 29 through a connector 18. Power lines (not shown) from the linear motor 29 are electrically connected to the coil selector 10 through the connector 18. As the power lines between the storage box 16 and linear motor 29 are covered by the connector 18 and a feed-through connector 9, they are not exposed to the vacuum atmosphere in the vacuum chamber 12. As a result, degassing from the power lines can be eliminated. When the coil support member of the linear motor 29 is formed as a counter mass 15, the power lines are not dragged between the coil selector 10 and the linear motor 29. Power lines 8' are dragged between a driver 11 and the storage box 16. However, as is exemplified in FIG. 5, since the number of power lines 8' is fewer than that of the power lines 8, the disturbance is small, and the posture accuracy of the stage apparatus 200 will not be influenced by the power lines 8'. In the same manner as in FIG. 1, a channel 17 through which a temperature-adjusting fluid flows can be formed between the interior of the storage box 16 and the outside of a vacuum chamber 12. A pipe 17 that forms the channel 17 is also dragged. If a flexible pipe 17 is selected, a large disturbance is not caused.

In this manner, according to this embodiment, since the power lines between the coil selector 10 and linear motor 29 can be covered, degassing from the power lines can be suppressed. Since the storage box 16 is mechanically connected to the linear motor 29 through the connector 18, the vacuum chamber 12 can be further downsized.

Figure 3:
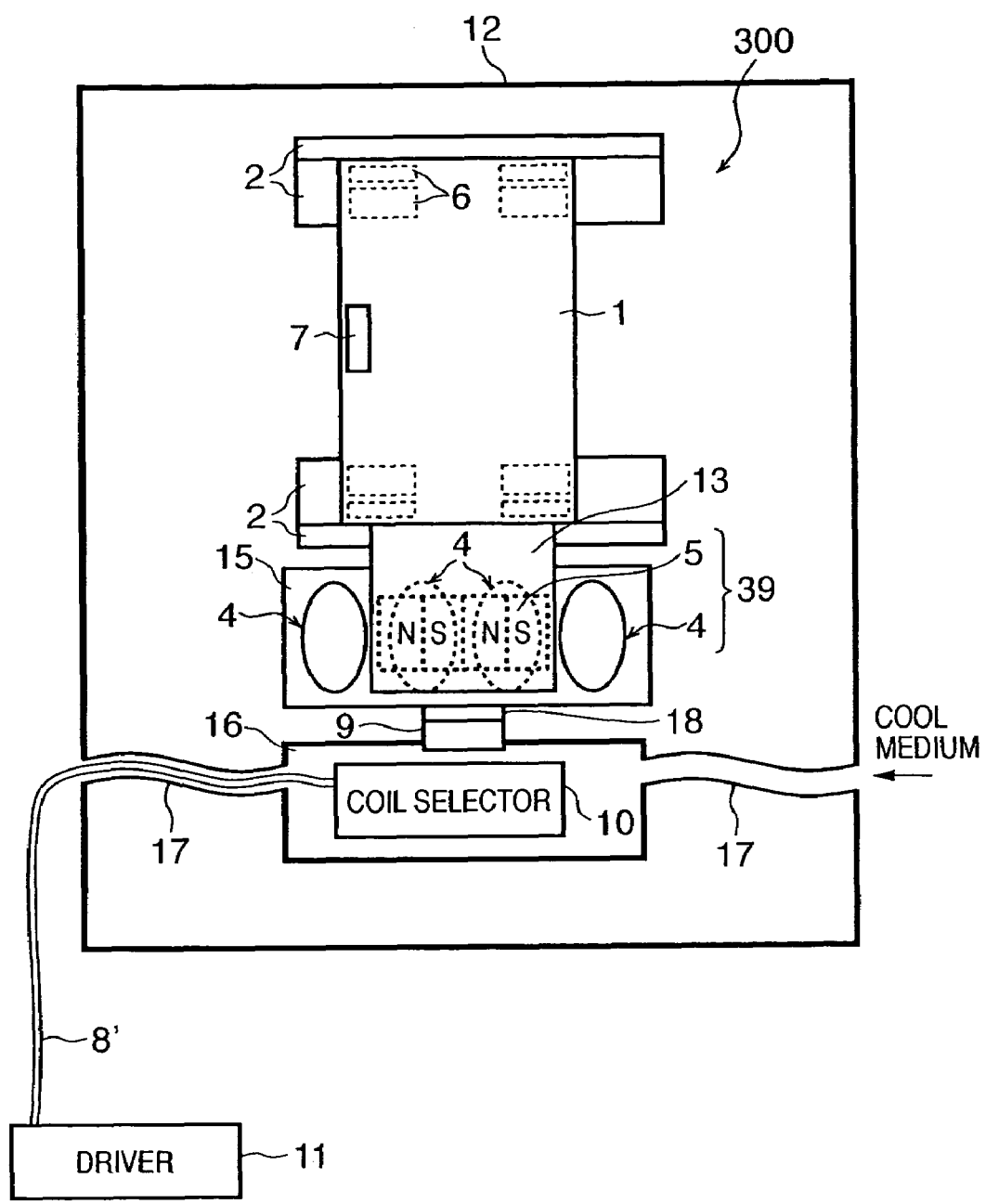
FIG. 3 is a view showing an alignment stage apparatus according to the third preferred embodiment of the present invention.
Figure 4:
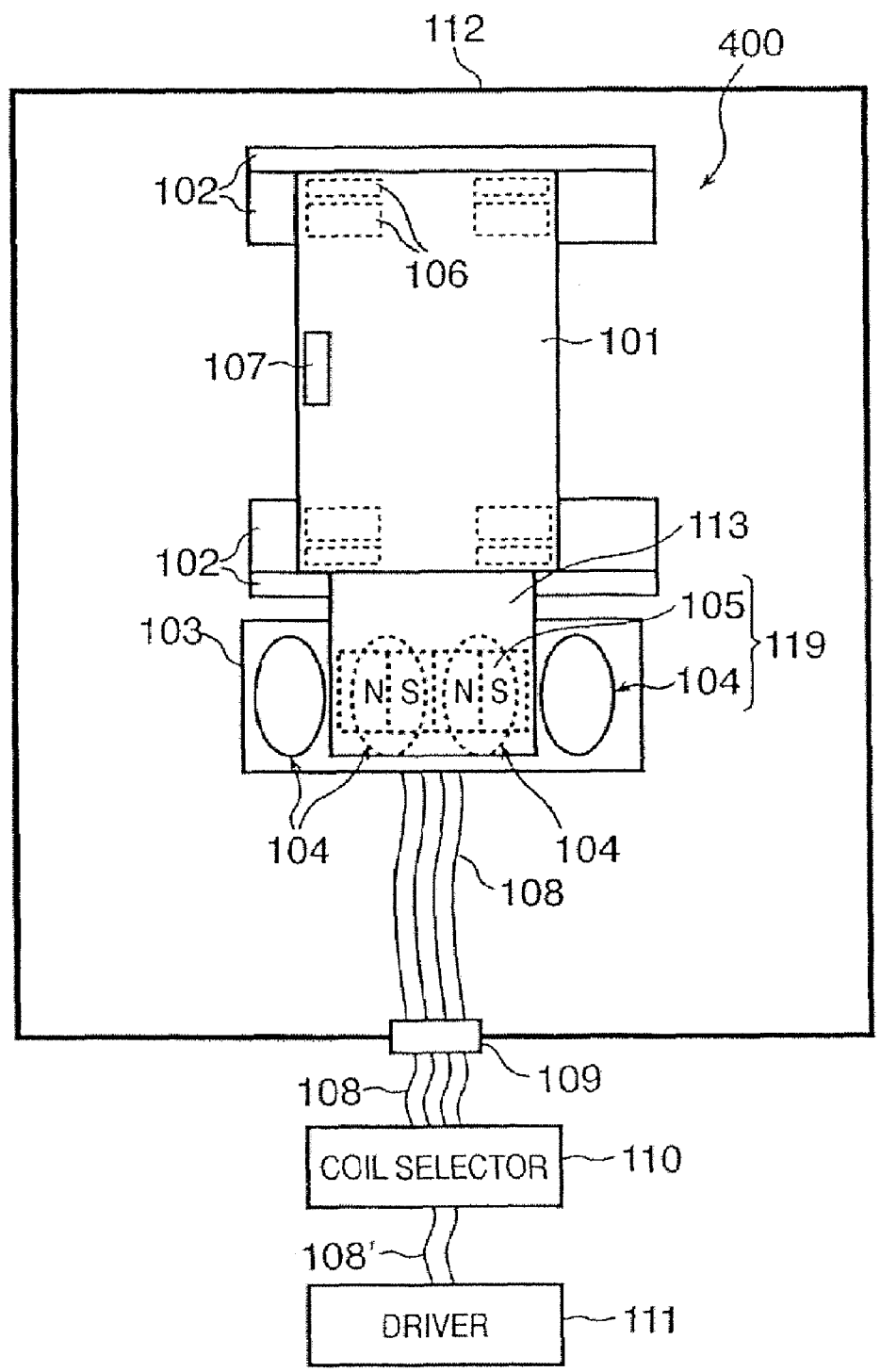
FIG. 4 is a view showing a conventional alignment stage apparatus to be applied to an exposure apparatus.

FIG. 3 is a view showing an alignment stage apparatus 300 according to the third preferred embodiment of the present invention. As shown in FIG. 3, a storage box 16 can be connected outside a vacuum chamber 12 through a pipe 17. Accordingly, if the diameter of the pipe 17 is selected appropriately, power lines 8' from a driver 11 can be wired to a coil selector 10 through the pipe 17. In this case, as the power lines 8' are not exposed in the vacuum chamber 12, degassing from the power lines 8' does not occur. If a fluid (e.g., a cooled fluid) is supplied to a channel 17 through which a temperature-adjusting fluid flows between the interior of the storage box 16 and the outside of the vacuum chamber 12, not only the coil selector 10, but also the power lines 8', can be cooled. As a result, trouble, such as disconnection caused when the power lines 8' generate heat, can be suppressed, so that the reliability can be improved.

In this manner, according to this embodiment, when the power lines 8' between the coil selector 10 and driver 11 are covered, degassing from the power lines 8' can be minimized, and trouble, such as disconnection caused when the power lines 8' generated heat, can be eliminated. Consequently, the reliability can be improved.

Figure 7:
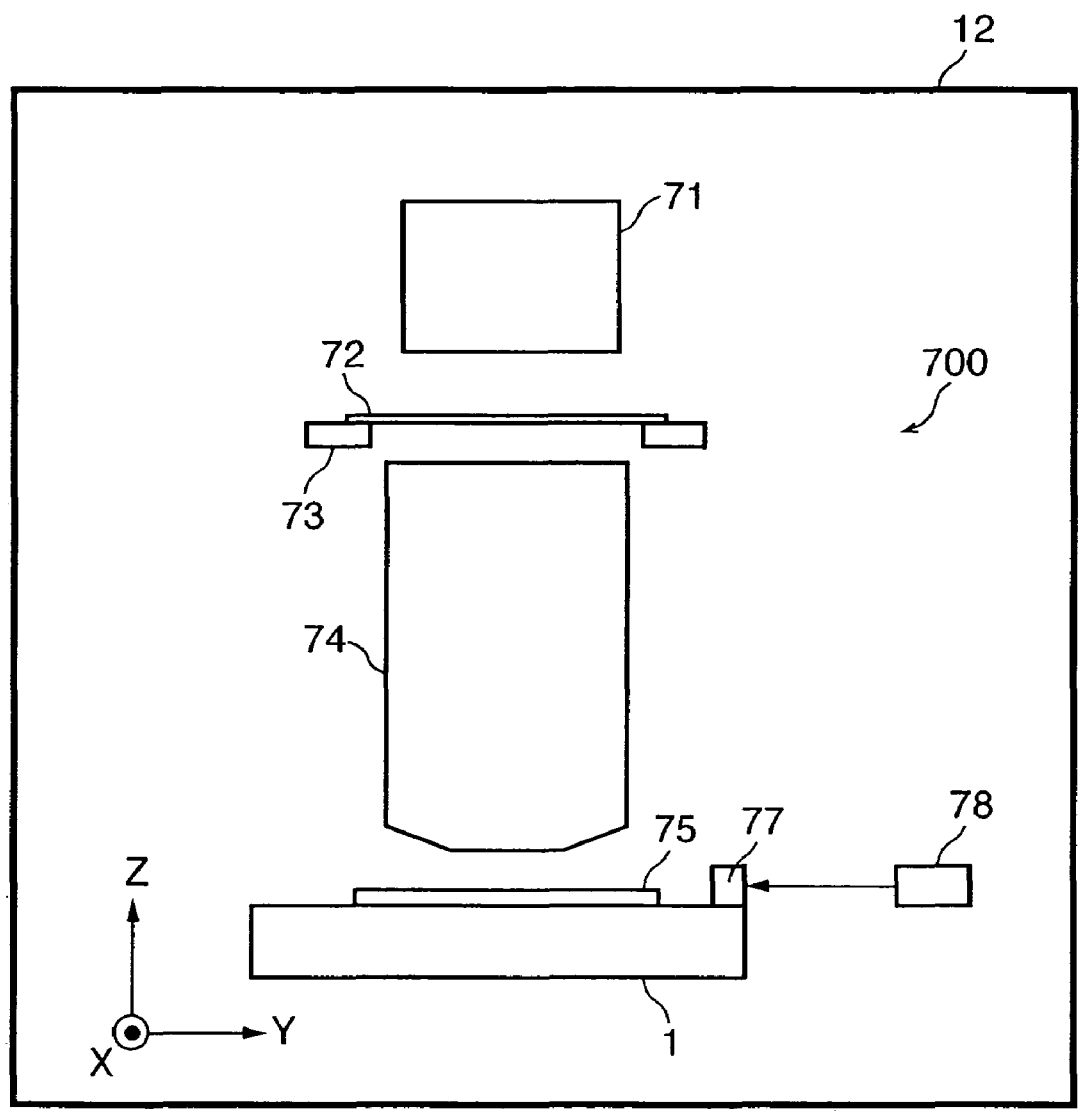
FIG. 7 is a conceptual view of an exposure apparatus to which an alignment stage apparatus according to a preferred embodiment of the present invention is applied.

FIG. 7 is a conceptual view of an exposure apparatus 700, which is used when the alignment stage apparatus 100, 200, or 300, according to a preferred embodiment of the present invention, is applied to a semiconductor device manufacturing process. The exposure apparatus 700 is arranged in the vacuum chamber 12.

Referring to FIG. 7, light emerging from an illumination optical system 71 irradiates a reticle 72 serving as a master. The reticle 72 is held on a reticle stage 73. The pattern of the reticle 72 is reduced and projected by the magnification of a reduction projection lens 74 to form a reticle pattern image on the image surface of the reduction projection lens 74. The image surface of the reduction projection lens 74 is perpendicular to the Z direction. The surface of a substrate 75 as an exposure target sample is coated with a resist, and shots formed in an exposure step are arrayed on the surface of the substrate 75. The substrate 75 is placed on the stage top plate (stage) 1 of the stage apparatus 100, 200, or 300, including a moving body, or the like. The stage top plate 1 includes a chuck which fixes the substrate 75, an X-Y stage movable horizontally in the X- and Y-axis directions, and the like. The position information on the stage top plate 1 is constantly measured by a stage interferometer 78, with reference to a mirror 77 fixed to the stage top plate 1. The stage apparatus 100, 200, or 300, according to the embodiment of the present invention, can generate a control signal from a position signal, or the like, output from the stage interferometer 78, so as to control the position of the stage top plate 1.

Figure 8:
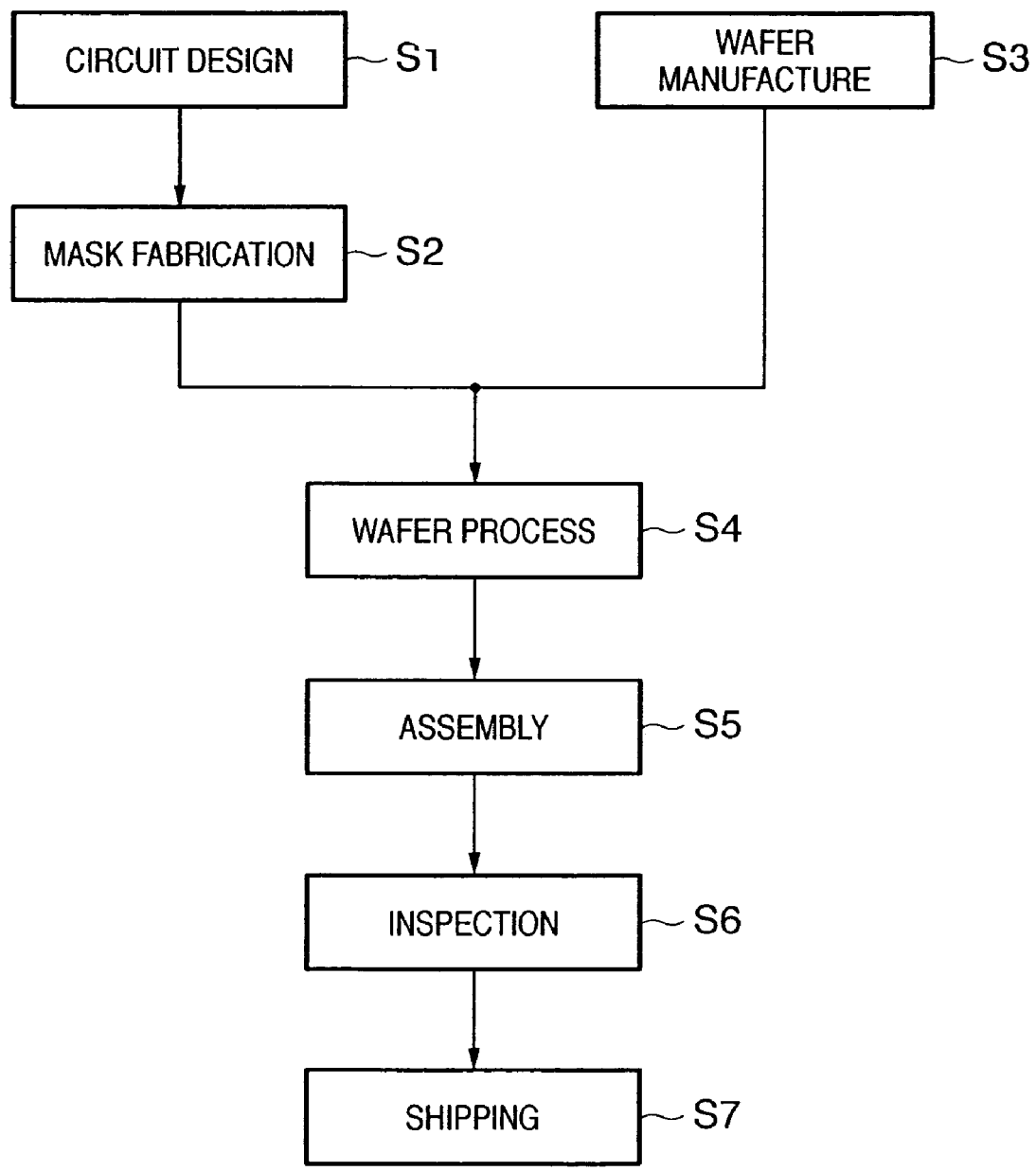
FIG. 8 is a flow chart showing an overall semiconductor device manufacturing process.

The semiconductor device manufacturing process using the exposure apparatus 700 will be described. FIG. 8 is a flow chart of an overall semiconductor device manufacturing process. In step 1 (circuit design), the circuit of a semiconductor device is designed. In step 2 (mask fabrication), a mask is fabricated based on the designed circuit pattern. In step 3 (wafer manufacture), a wafer is manufactured using a material such as silicon. In step 4 (wafer process), called a preprocess, an actual circuit is formed on the wafer by the exposure apparatus 700 in accordance with lithography using the prepared mask and wafer. In step 5 (assembly), called a post-process, a semiconductor chip is formed from the wafer fabricated in step 5. This step includes processes such as assembling (dicing and bonding) and packaging (chip encapsulation). In step 6 (inspection), inspections, such as an operation check test and a durability test of the semiconductor device fabricated in step 5, are performed. A semiconductor device is completed with these processes, and shipped in step 7.

The wafer process of step 4 has the following steps an oxidation step of oxidizing the surface of the wafer, a CVD step of forming an insulating film on the wafer surface, an electrode formation step of forming an electrode on the wafer by deposition, an ion implantation step of implanting ions into the wafer, a resist process step of applying a photosensitive agent to the wafer, an exposure step of transferring the circuit pattern to the wafer after the resist process step by the exposure apparatus 700, a developing step of developing the wafer exposed in the exposure step, an etching step of etching portions other than the resist image developed in the developing step, and a resist removing step of removing any unnecessary resist remaining after etching. By repeating these steps, a multilayered structure of circuit patterns is formed on the wafer.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-317322, filed on Sep. 9, 2003, which is hereby incorporated by reference herein.

What is claimed is:

1. An alignment stage apparatus comprising:
a vacuum chamber;
a linear motor including a plurality of coils to drive a stage;
a coil selector which selectively energizes said plurality of coils; and
a storage box arranged to store said coil selector, the interior of said storage box being connected to the outside of said vacuum chamber,
wherein said linear motor and said storage box are arranged in said vacuum chamber.

2. The apparatus according to claim 1, further comprising a channel for supplying a temperature-adjusting fluid between the interior of said storage box and the outside of said vacuum chamber.

3. The apparatus according to claim 1, further comprising:
a first power line which electrically connects said plurality of coils and said coil selector;
a driver which is arranged outside said vacuum chamber and selectively energizes said plurality of coils; and a second power line which electrically connects said coil selector and driver, wherein a length of said first power line is less than that of said second power line.

4. The apparatus according to claim 1, wherein said storage box is mechanically connected to said linear motor through a connector.

5. The apparatus according to claim 4, wherein said first power line is electrically connected to said plurality of coils through said connector.

6. An exposure apparatus comprising:

an alignment stage apparatus according to claim 1, which holds and aligns a master or a substrate; and an optical system which is arranged in said vacuum chamber of said alignment stage apparatus and projects exposure light irradiating the master having a pattern onto a substrate.

7. A semiconductor device manufacturing method comprising:

a step of exposing a pattern onto a substrate by using an exposure apparatus according to claim 6; and a step of developing the substrate on which the pattern has been transferred in the step of exposing.

* * * * *